United States Patent [19]
Yeh et al.

[11] Patent Number: 5,691,953
[45] Date of Patent: Nov. 25, 1997

[54] ADDRESS BUFFER FOR HIGH SPEED STATIC RANDOM-ACCESS-MEMORY DEVICES

[75] Inventors: Wen Chih Yeh, Hsinchu Hsien; Hsiao-Yueh Chang, Taipei, both of Taiwan

[73] Assignee: United Microelectronics Corporation, Hsinchu, Taiwan

[21] Appl. No.: 629,641

[22] Filed: Apr. 9, 1996

[51] Int. Cl.[6] .................................................. G11C 8/00
[52] U.S. Cl. ........................ 365/230.08; 365/189.05
[58] Field of Search ................ 365/230.08, 189.05, 365/189.01, 230.01

[56] References Cited

U.S. PATENT DOCUMENTS 4,707,809  11/1987  Ando ........................ 365/230.08 X
4,825,420  4/1989  Min ........................... 365/230.08

*Primary Examiner*—Joseph A. Popek
*Attorney, Agent, or Firm*—Fish & Richardson P.C.

[57] ABSTRACT

An address buffer for high speed static random-access-memory (SRAM) devices is disclosed. The address buffer includes a buffer stage, an out-phase variable buffer circuit and an in-phase variable buffer circuit. The buffer stage includes a number of series-connected buffer units for transmitting an input address signal. The out-phase variable buffer circuit is connected to the buffer stage for providing a first buffer condition in a write period and for providing a second buffer condition in a read period. The in-phase variable buffer circuit is also connected to the buffer stage for providing a third buffer condition in the write period and for providing a fourth buffer condition in the read period. An external address signal can be delayed by the various buffer conditions of the address buffer during the write period to optimize the operation of the SRAM devices, and the various buffer conditions will not affect the read period.

10 Claims, 2 Drawing Sheets

ADDRESS BUFFER FOR HIGH SPEED STATIC RANDOM-ACCESS-MEMORY DEVICES

BACKGROUND OF THE INVENTION

1. Field of the Invention

The present invention relates to a semiconductor static random-access-memory (SRAM) device, and more specifically, to an address buffer for receiving an external address signal to address the SRAM device.

2. Technical Background

A conventional SRAM device is provided with a memory cell array for data storage. The memory cell array, which is composed of a number of memory cells, can be addressed by an external address signal to select a proper cell for data read or write operations. For example, referring to FIG. 1, a schematic diagram of a SRAM device is illustrated. The device includes an address buffer 10', an address decoder 20', a control circuit 40, a data buffer 50 and, most importantly, a memory cell array 60. Control circuit 40 receives external control signals to control address buffer 10', address decoder 20' and data buffer 50. Data buffer 50 is provided for writing external data into memory cell array 60 or reading data from memory cell array 60.

The SRAM device is generally utilized as a high-speed cache memory device in a computer system. Since the performance of the computer has been greatly improved, the read and/or write rate of the cache memory device has to be increased accordingly. In order to increase the operation rate of the SRAM device, elements in each data read path of the cache memory device should be optimized to have minimal delay time. However, in the conventional memory circuit, increasing the read operation rate may result in data read/write errors. For example, a word line in the memory cell array of the SRAM device may be turned on before a write enable signal terminating a previous data write period of the device. Since the word line selects a new memory cell in the SRAM device, a signal may be erroneously read from or written into the new memory cell before the previous write period is terminated. This error will be a serious problem for a SRAM device in which a conventional address buffer is utilized.

The circuit structure of conventional address buffer 10' is illustrated in FIG. 2. Referring to the figure, address buffer 10' includes a buffer stage, an in-phase buffer circuit and an out-phase buffer circuit. The buffer stage is composed of a NOR gate 11 and invertors 12 and 13. The out-phase buffer circuit is composed of invertors 14 and 15. The in-phase buffer circuit is composed of invertors 16, 17 and 18. Address buffer 10' receives an external address signal XA. Through the buffer stage, the in-phase buffer circuit and the out-phase buffer circuit, signal XA can be transferred into an in-phase address signal XI and an out-phase address signal XIB. The address signals will be decoded into word line signals and select specific memory cells for a data read or write operation. Since the buffer circuit is composed of a fixed number of delay elements, the delay time of the address signal is a constant value in both the data read period and the data write period. Therefore, the time that the word line is turned on by the decoded address signals can not be adjusted by address buffer 10'. In order to prevent the occurrence of a data read/write error, the circuit structure and operation of address buffer 10' have to be modified.

SUMMARY OF THE INVENTION

Accordingly, the present invention provides an address buffer to tune the delay time of the address signals for the conditions of data-read-period or data-write-period, thereby preventing data read/write errors.

The SRAM address buffer of the present invention includes a buffer stage, an out-phase variable buffer circuit and an in-phase variable buffer circuit. The buffer stage includes a number of series-connected buffer units for transmitting an input address signal. The out-phase variable buffer circuit is connected to the buffer stage for providing a first buffer condition in the write period and for providing a second buffer condition in the read period. The in-phase variable buffer circuit is also connected to the buffer stage for providing a third buffer condition in the write period and providing a fourth buffer condition in the read period. An out-phase address signal can be generated by the out-phase variable buffer circuit to have a longer rising time under the first buffer condition than under the second buffer condition. Similarly, the in-phase address signal can be generated by the in-phase variable buffer circuit to have a longer rising time under the third buffer condition than under the fourth buffer condition. The rising time variation of the address signals can prevent the occurrence of data read/write errors, thus optimizing the performance of the SRAM device.

BRIEF DESCRIPTION OF THE DRAWINGS

Other objects, features, and advantages of the present invention will become apparent from the following detailed description of the preferred but non-limiting embodiment. The description is made with reference to the accompanying drawings in which.

DETAILED DESCRIPTION OF THE PREFERRED EMBODIMENTS

Figure 1:
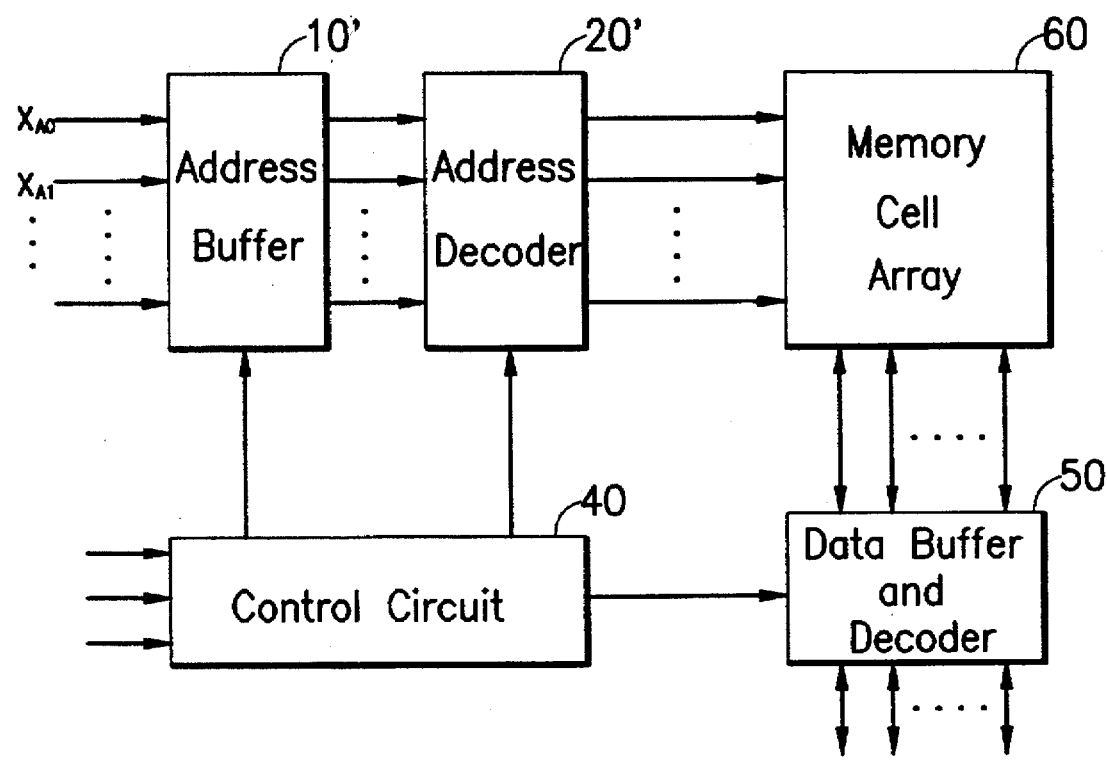
FIG. 1 illustrates a prior art address buffer in a SRAM device.
Figure 2:
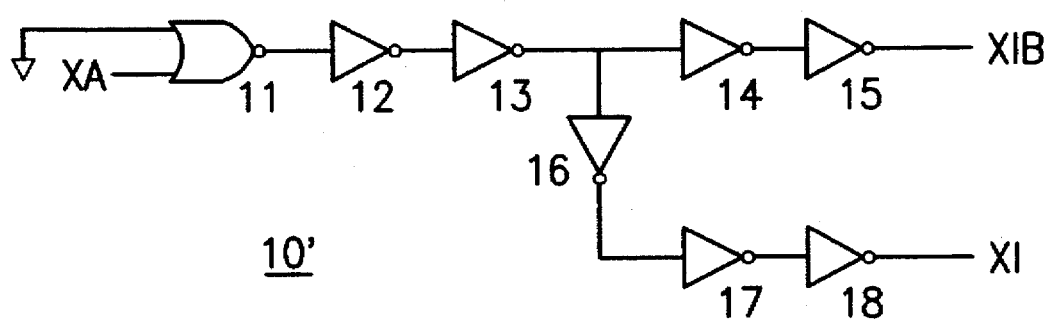
FIG. 2 is a circuit diagram of a prior art address buffer.
Figure 3:
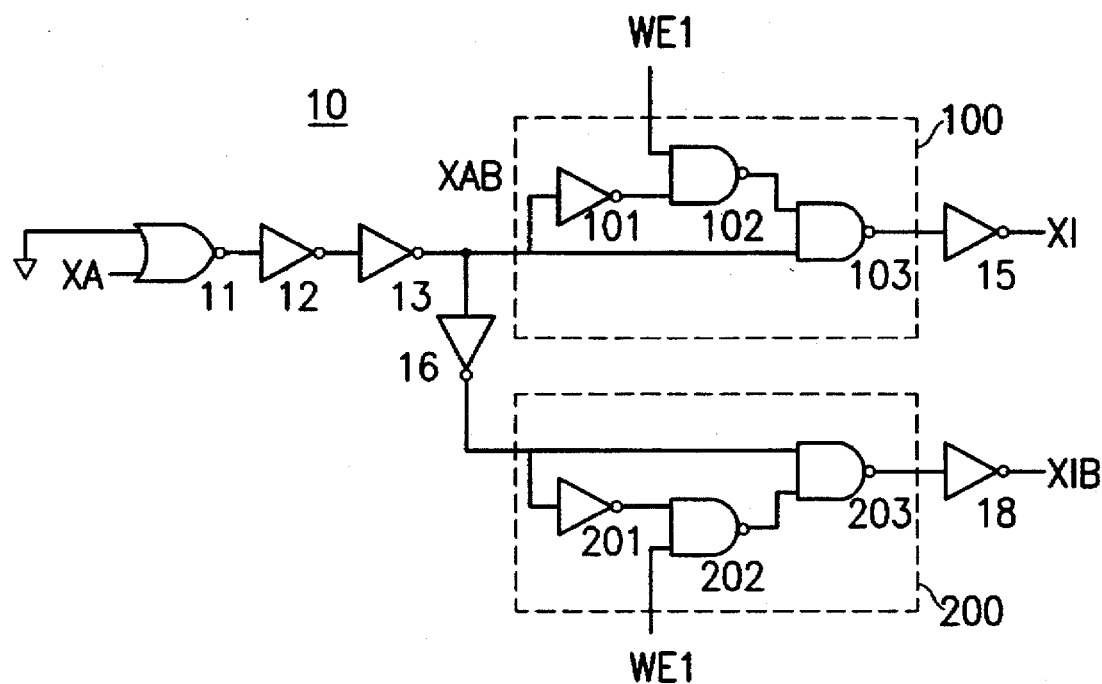
FIG. 3 is a circuit diagram of an address buffer according to one preferred embodiment of the invention.

Address buffer 10 according to the preferred embodiment of the present invention is depicted in FIG. 3. Referring to the figure, address buffer 10 consists of a buffer stage, an out-phase variable buffer circuit and an in-phase variable buffer circuit. Through the buffer stage, the out-phase variable buffer circuit and the in-phase variable buffer circuit, signal XA can be transferred into an out-phase address signal XIB and an in-phase address signal XI. The buffer stage includes a number of buffer units which can be invertors. In the present embodiment, three buffer units, including NOR gate 11 and invertors 12 and 13, are connected in series to form a delay path for transferring input address signal XA. NOR gate 11 has two input ends, wherein one end is provided for address signal XA and the other end is grounded. There can be more or less than three buffer units in the buffer stage, because the number of buffer units in the buffer stage can be adjusted in accordance with the required delay time for address signal XA.

The out-phase variable buffer circuit is connected to the last buffer unit (invertor 13) of the buffer stage. The out-phase variable buffer circuit includes a variable buffer stage 100 and an invertor 15. Variable buffer stage 100 can provide a first buffer condition in the data write period and can provide a second buffer condition in the data read period. In the preferred embodiment of the present invention, out-phase address signal XIB has a longer rising time under the first buffer condition than under the second buffer condition. Referring to the figure, variable buffer stage 100 is composed of an invertor 101, a first NAND gate 102 and a second NAND gate 103. Invertor 101 receives the delayed address signal XAB from the buffer stage. The output end of invertor 101 is connected to a first input end of first NAND gate 102. A second input end of first NAND gate 102 must be at a high logic level during the data write period, otherwise it is at a low logic level. In order to satisfy the requirement, the second input end of NAND gate 102 can be controlled by a write enable signal WE1. One of the two input ends of second NAND gate 103 receives signal XAB from the buffer stage, and the other is connected to the output of first NAND gate 102. Invertor 15 is connected to the output end of second NAND gate 103.

The in-phase variable buffer circuit is also connected to the last buffer unit of the buffer stage. The in-phase variable buffer circuit includes an invertor 16, a variable buffer stage 200 and an invertor 18. Variable buffer stage 200 can provide a third buffer condition in the data write period and can provide a fourth buffer condition in the data read period. Similar to the out-phase variable buffer circuit, variable buffer stage 200 is composed of an invertor 201, a first NAND gate 202 and a second NAND gate 203. Invertor 16 receives delayed address signal XAB from the buffer stage. Then the signal is sent to invertor 201 of variable buffer stage. The output end of invertor 201 is connected to a first input end of first NAND gate 202. A second input end of first NAND gate 202 must be at a high logic level during the data write period, otherwise it is at a low logic level. In order to satisfy the requirement, the second input end of NAND gate 202 can be controlled by write enable signal WE1. One of the two input ends of second NAND gate 203 is connected to invertor 16, and the other is connected to the output of first NAND gate 202. Invertor 18 is connected to the output end of second NAND gate 203.

Since both variable buffer stages 100 and 200 are controlled by write enable signal WE1, different delay paths can be provided in the data read period and the data write period. In the present embodiment, the logic level of write enable signal WE1 is high during the data write period and is low otherwise. Therefore the delay paths can be determined by the logic level of write enable signal WE1.

For example, when the SRAM device is in the data write period, i.e., when write enable signal WE1 is high, NAND gates 102 and 202 are controlled by the outputs of invertors 101 and 201, respectively. Since invertors 101 and 201 and NAND gates 102 and 202 serve as additional delay elements for any signal shifting from a low level to a high level, the rising edge of address signal XAB from the buffer stage will be delayed after the out-phase and the in-phase variable buffer circuits. Moreover, since the aforementioned additional delay elements have no influence on a signal falling from the high level to the low level, the falling edges of the address signals (XI or XIB) are not changed. That is, invertor 101 and NAND gates 102 of the out-phase variable buffer circuit provide the first buffer condition to delay the rising time of signal XIB but leave the falling time unchanged. Similarly, the rising time of signal XI is delayed through the third buffer condition which provided by invertor 201 and NAND gate 202 of the in-phase variable buffer circuit.

When the SRAM device is in data read period, write enable signal WE1 is disabled, i.e., WE1 is low, and both first NAND gates 102 and 202 have output signals of a high level signal. Therefore, the additional delay elements, including invertors 101 and 201 and NAND gates 102 and 202, are also disabled, and the operation of out-phase and in-phase variable buffer circuit is equivalent to that of the prior art address buffer 10'.

Figure 4:
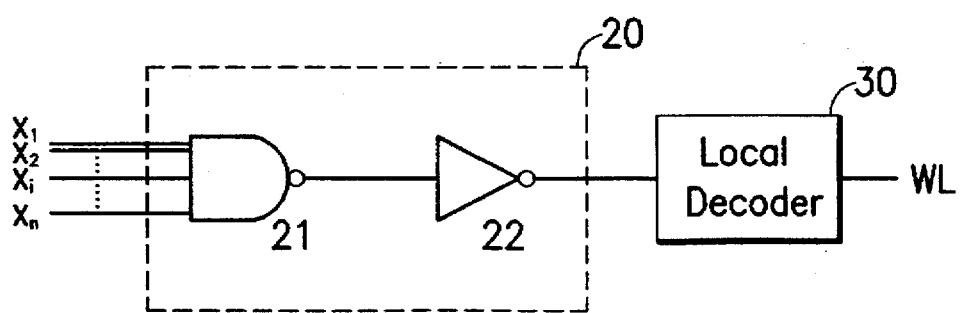
FIG. 4 illustrates the connection relationships between the address buffer and the address decoder.

In the SRAM device, there is more than one address signal which has to be transferred by address buffer 10. These signals, after address buffer 10, are then processed by a circuit 20 which is provided with a high state enable status. Referring to FIG. 4, address signals $X_1$ through $X_N$ are level shifted by circuit 20 and then decoded into word line signal WL in local decoder 30. Since the rising edges of the address signals are properly delayed in the data write period, word line WL will not be turned on too early, and the data write error will not occur in the SRAM device.

What is claimed is:

1. An address buffer receiving an address signal and addressing a memory cell array of a static random-access-memory (SRAM) device in either a read period or a write period, said address buffer comprising:
   a buffer stage which transmits said address signal, said buffer stage including a number of series-connected buffer units;
   an out-phase variable buffer circuit connected to said buffer stage, said out-phase variable buffer circuit providing a first buffer characteristic in said write period and providing a second buffer characteristic in said read period, wherein said first buffer characteristic is different from said second buffer characteristic; and
   an in-phase variable buffer circuit, which provides a third buffer characteristic in said write period and a fourth buffer characteristic in said read period, wherein said third buffer characteristic is different from said fourth buffer characteristic.

2. The address buffer of claim 1, wherein said series connected buffer units comprise invertors.

3. The address buffer of claim 1, wherein said out-phase variable buffer circuit includes:
   a first variable buffer stage connected to said buffer stage, said first variable buffer stage providing said first buffer characteristic and said second buffer characteristic; and
   a first invertor connected to said first variable buffer stage, said first invertor outputting an out-phase address signal.

4. The address buffer of claim 3, wherein said out-phase address signal has a longer rising time under said first buffer characteristic than said second buffer characteristic.

5. The address buffer of claim 3, wherein said first variable buffer stage of said out-phase variable buffer circuit comprises:
   a second invertor connected to said buffer stage;
   a first NAND gate having a first input end, a second input end and an output end; said first input end connected to said second invertor; said second input end being at a high logic level during said write period, and otherwise being at a low logic level; and
   a second NAND gate having two input ends; one of said input ends of said second NAND gate connected to said output end of said first NAND gate; the other input end of said second NAND gate connected to said buffer stage.

6. The address buffer of claim 5, wherein said second input end of said first NAND gate is controlled by a data write enable signal which starts and terminates said write period.

7. The address buffer of claim 1, wherein said in-phase variable buffer circuit includes:
   a pre-stage invertor connected to said buffer stage;

a first variable buffer stage connected to said pre-stage invertor, said first variable buffer stage providing said third buffer characteristic and said fourth buffer characteristic; and a first invertor connected to said second variable buffer stage, said first invertor outputting an in-phase address signal.

8. The address buffer of claim 7, wherein said in-phase address signal has a longer rising time under said third buffer characteristic than said fourth buffer characteristic.

9. The address buffer of claim 7, wherein said first variable buffer stage comprises:

a second invertor connected to said buffer stage;

a first NAND gate provided with a first input end, a second input end and an output end; said first input end of said first NAND gate connected to said second invertor; said second input end of said first NAND gate being at a high logic level during said write period, and otherwise being at a low logic level; and a second NAND gate having two input ends; one of said input ends of said second NAND gate connected to said output end of said first NAND gate; the other input end of said second NAND gate connected to said buffer stage.

10. The address buffer of claim 9, wherein said second input end of said first NAND gate is controlled by a data write enable signal which starts and terminates said write period.

\* \* \* \* \*